United States Patent
Yang et al.

(10) Patent No.: US 12,274,045 B2
(45) Date of Patent: Apr. 8, 2025

(54) WELL PICK-UP REGION DESIGN FOR IMPROVING MEMORY MACRO PERFORMANCE

(71) Applicant: Taiwan Semiconductor Manufacturing Co., Ltd., Hsin-Chu (TW)

(72) Inventors: Chih-Chuan Yang, Hsinchu (TW); Chang-Ta Yang, Hsinchu (TW); Ping-Wei Wang, Hsin-Chu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 18/444,889

(22) Filed: Feb. 19, 2024

(65) Prior Publication Data

US 2024/0237323 A1    Jul. 11, 2024

Related U.S. Application Data

(60) Continuation of application No. 17/873,626, filed on Jul. 26, 2022, now Pat. No. 11,910,585, which is a division of application No. 16/657,421, filed on Oct. 18, 2019, now Pat. No. 11,600,623.

(60) Provisional application No. 62/771,455, filed on Nov. 26, 2018.

(51) Int. Cl.
*H10B 10/00* (2023.01)
*G06F 30/30* (2020.01)
*G11C 11/412* (2006.01)

(52) U.S. Cl.
CPC ............ *H10B 10/00* (2023.02); *G06F 30/30* (2020.01); *G11C 11/412* (2013.01)

(58) Field of Classification Search
None
See application file for complete search history.

(56) References Cited

U.S. PATENT DOCUMENTS

| | | |
|---|---|---|
| 6,768,144 B2 | 7/2004 | Houston et al. |
| 7,586,147 B2 | 9/2009 | Liaw |
| 8,693,235 B2 | 4/2014 | Liaw |
| 9,607,685 B2 | 3/2017 | Liaw |

(Continued)

FOREIGN PATENT DOCUMENTS

| | | |
|---|---|---|
| KR | 20170015074 A | 2/2017 |
| TW | 201705375 A | 2/2017 |

*Primary Examiner* — Nishath Yasmeen
(74) *Attorney, Agent, or Firm* — HAYNES AND BOONE, LLP

(57) ABSTRACT

Well pick-up (WPU) regions are disclosed herein for improving performance of memory arrays, such as static random access memory arrays. An exemplary semiconductor device includes a circuit region, a first WPU region, second WPU region, a first well of a first conductivity type, and a second well of a second conductivity type. The circuit region, the first WPU region, and the second WPU region are arranged along a first direction in sequence. The first well has a first portion disposed in the circuit region and a second portion disposed in the first WPU region. The second well has a first portion disposed in the circuit region, a second portion disposed in the first WPU region, and a third potion disposed in the second WPU region. Measured along the first direction a width of the first WPU region is less than a width of the second WPU region.

20 Claims, 9 Drawing Sheets

(56) References Cited

U.S. PATENT DOCUMENTS

| | | | |
|---|---|---|---|
| 9,646,973 B2 | 5/2017 | Liaw | |
| 9,691,471 B2 | 6/2017 | Liaw | |
| 9,871,048 B1* | 1/2018 | Huang | H01L 27/0207 |
| 10,157,987 B1* | 12/2018 | Liaw | H01L 29/7848 |
| 2014/0153321 A1* | 6/2014 | Liaw | G11C 11/413 |
| | | | 365/154 |
| 2014/0177312 A1 | 6/2014 | Shibata et al. | |
| 2016/0049410 A1 | 2/2016 | Seshadri et al. | |
| 2016/0372182 A1 | 12/2016 | Liaw | |
| 2017/0032835 A1* | 2/2017 | Liaw | G11C 11/412 |

* cited by examiner

WELL PICK-UP REGION DESIGN FOR IMPROVING MEMORY MACRO PERFORMANCE

PRIORITY

This is a continuation application of U.S. patent application Ser. No. 17/873,626 filed Jul. 26, 2022, which is a divisional application of U.S. patent application Ser. No. 16/657,421 filed Oct. 18, 2019, issued U.S. Pat. No. 11,600,623, which claims benefit of U.S. Provisional Patent Application Ser. No. 62/771,455, filed Nov. 26, 2018, the entire disclosures of which are incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, in memory devices, such as static random-access memory (SRAM), leakage issue becomes more severe in advanced process nodes. SRAM generally refers to a memory or a storage that can retain stored data only when power is applied. Since SRAM cell performance is largely layout dependent (for example, it has been observed that an inner SRAM cell of an SRAM macro will perform differently than an edge SRAM cell of the SRAM macro), well pick-up regions (or areas) have been implemented to stabilize well potential, facilitating uniform charge distribution throughout an SRAM macro, and thus uniform performance among SRAM cells of the SRAM array. However, as circuit geometry shrinks, leakage between adjacent n-type wells (or n-wells) and p-type wells (or p-wells) becomes more severe due to dopant diffusion. This leads to higher n-well and p-well resistance in well pick-up regions and higher pick-up resistance, which deteriorates latch-up performance. Accordingly, although existing well pick-up region designs for SRAM macros have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
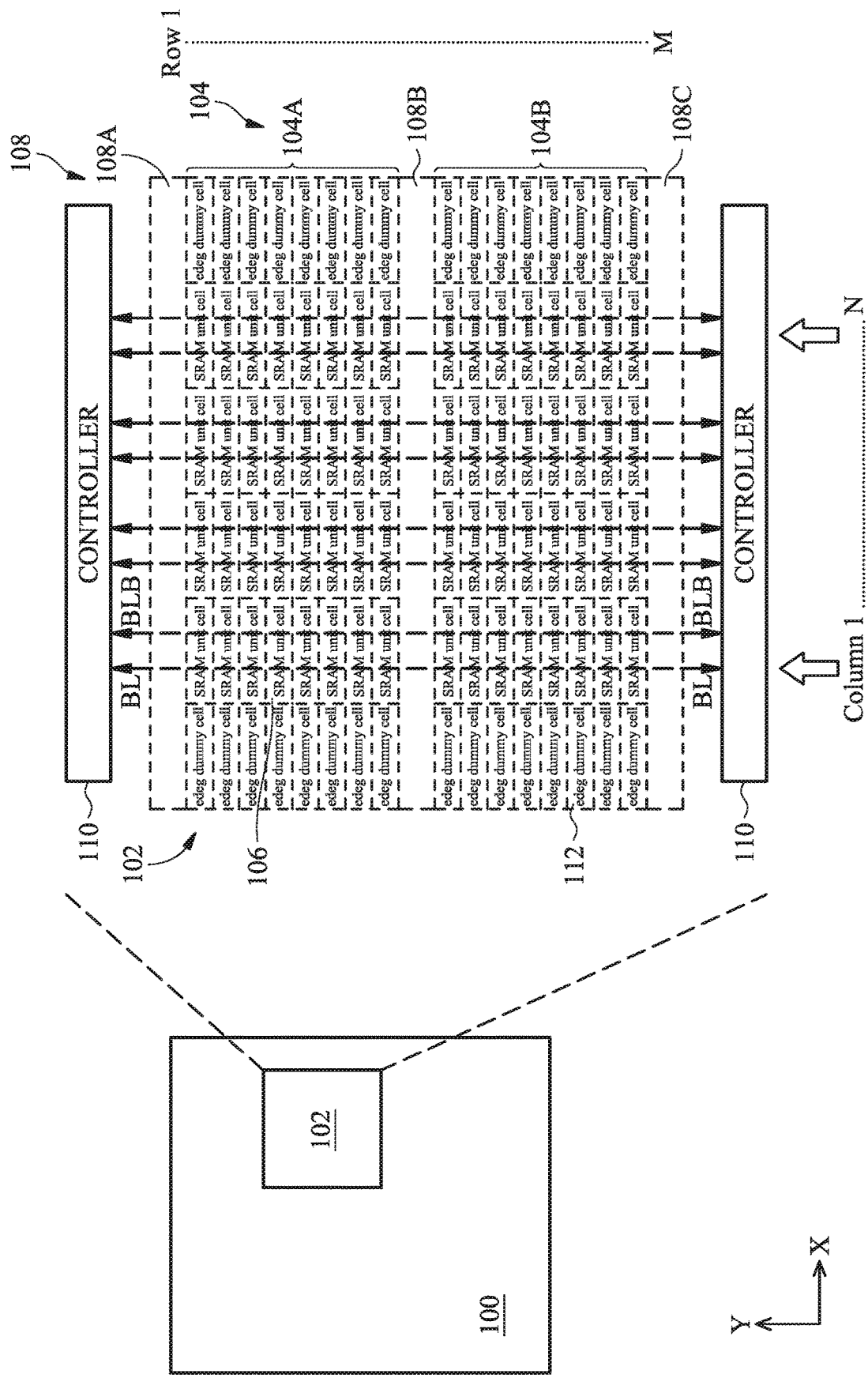
FIG. 1 is a simplified block diagram of an integrated circuit (IC) with an embedded memory macro, according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to semiconductor devices, and more particularly to the placement of n-wells and p-wells in a memory macro's well pick-up (WPU) regions. The WPU regions provide well pick-up structures (or tap structures), such as well tap contact plugs, in the memory macro. The well pick-up structures provide access to the n-wells and p-wells underlying the transistors in the memory macro. For example, tester pins may contact the well pick-up structures to provide voltages to the wells during manufacturing testing. For example, package pins or pads may be connected to the well pick-up structures in a final IC having the memory macro. The n-wells and p-wells (which are doped with opposite dopants) are arranged alternately in a memory macro (i.e., an n-well is next to a p-well which is next to another n-well) and have separate well pick-up structures. Opposite dopants diffuse through well boundaries between adjacent n-wells and p-wells and create diffusion areas along well boundaries. The diffusion areas reduce effective widths of n-wells and p-wells and lead to higher well pick-up resistance. As the widths of n-wells and p-wells continue to scale down with modern technology nodes, the negative impact of diffusion areas on well pick-up resistance becomes more threatening to circuit functions. For example, leakage current between the oppositely doped wells becomes a concern with higher well pick-up resistance because it may trigger latch-up more easily in the circuit. An object of the present disclosure is to mitigate this problem by arranging the placement of n-wells and p-wells in a memory macro's WPU regions to reduce well pick-up resistance.

FIG. 1 shows a semiconductor device 100 with a memory macro 102. The semiconductor device 100 can be, e.g., a microprocessor, an application specific integrated circuit (ASIC), a field programmable gate array (FPGA), or a digital signal processor (DSP). Further, semiconductor device 100 may be a portion of an IC chip, an SoC, or portion thereof, that includes various passive and active microelectronic devices such as resistors, capacitors, inductors, diodes, PFETs, NFETs, MOSFETs, CMOS transistors, BJTs, LDMOS transistors, high voltage transistors, high frequency transistors, other suitable components, or combinations thereof. The exact functionality of semiconductor device 100 is not a limitation to the provided subject matter. In the illustrated embodiment, memory macro 102 is a static random access memory (SRAM) macro, such as a single-port SRAM macro, a dual-port SRAM macro, or other types of SRAM macro. However, the present disclosure contemplates embodiments, where memory macro 102 is another type of memory, such as a dynamic random access memory (DRAM), a non-volatile random access memory (NVRAM), a flash memory, or other suitable memory. FIG. 1 has been simplified for the sake of clarity to better understand the inventive concepts of the present disclosure. Additional features can be added in memory macro 102, and some of the features described below can be replaced, modified, or eliminated in other embodiments of memory macro 102.

Memory macro 102 includes one or more circuit regions 104, such as circuit regions 104A and 104B in the illustrated embodiment. Circuit regions 104 contain all the memory cells 106 of memory macro 102. Circuit regions 104 are also referred to as memory cell regions 104. Memory cells 106 are generally implemented in forms of arrays in circuit regions 104. Each memory cell 106, such as an SRAM memory cell, is configured to store data. Memory cell 106 may be implemented with various PMOS and NMOS transistors such as planar transistors, FinFET, gate-all-around (GAA) nanosheet transistors, GAA nanowire transistors, or other types of transistors. In the illustrated embodiment, memory cells 106 include various p-type FinFETs and n-type FinFETs.

Memory macro 102 also includes one or more strap regions 108, such as strap regions 108A, 108B, and 108C oriented lengthwise along an x-direction in the illustrated embodiment. Strap regions 108A and 108C are located at the edge of memory macro 102 and strap region 108B is located between circuit regions 104A and 104B. Each of strap regions 108 does not contain memory cells and is used for implementing well pick-up structures. A well pick-up structure is generally configured to electrically couple a voltage to an n-well of memory cells 106 or a p-well of memory cells 106. Strap regions 108 are also referred to as well pick-up (WPU) regions 108.

Further, memory macro 102 may include various contact features (or contacts), vias, and metal lines for connecting the source, drain, and gate electrodes (or terminals) of the transistors to form an integrated circuit.

Still referring to FIG. 1, memory cells 106 are arranged in column 1 to column N each extending along a first direction (here, in a y-direction) and row 1 to row M each extending along a second direction (here, in an x-direction), where N and M are positive integers. Column 1 to column N each include a bit line pair extending along the first direction, such as a bit line (BL) and a bit line bar (BLB) (also referred to as a complementary bit line), that facilitate reading data from and/or writing data to respective memory cells 106 in true form and complementary form on a column-by-column basis. Row 1 to row M each includes a word line (WL) (not shown) that facilitates access to respective memory cells 106 on a row-by-row basis. Each memory cell 106 is electrically connected to a respective BL, a respective BLB, and a respective WL, which are electrically connected to a controller 110. Controller 110 is configured to generate one or more signals to select at least one WL and at least one bit line pair (here, BL and BLB) to access at least one of memory cells 106 for read operations and/or write operations. Controller 110 includes any circuitry suitable to facilitate read/write operations from/to memory cells 106, including but not limited to, a column decoder circuit, a row decoder circuit, a column selection circuit, a row selection circuit, a read/write circuit (for example, configured to read data from and/or write data to memory cells 106 corresponding to a selected bit line pair (in other words, a selected column)), other suitable circuit, or combinations thereof. In some implementations, controller 110 includes at least one sense amplifier (not shown) configured to detect and/or amplify a voltage differential of a selected bit line pair. In some implementations, the sense amplifier is configured to latch or otherwise store data values of the voltage differential.

A perimeter of memory macro 102 is configured with dummy cells, such as edge dummy cells 112, to ensure uniformity in performance of memory cells 106. Dummy cells are configured physically and/or structurally similar to memory cells 106, but do not store data. For example, dummy cells can include p-type wells, n-type wells, fin structures (including one or more fins), gate structures, source/drain features, and/or contact features. In the illustrated embodiment, row 1 to row M each begins with an edge dummy cell 112 and ends with an edge dummy cell 112, such that row 1 to row M of memory cells 106 are disposed between two edge dummy cells 112.

Figure 2:
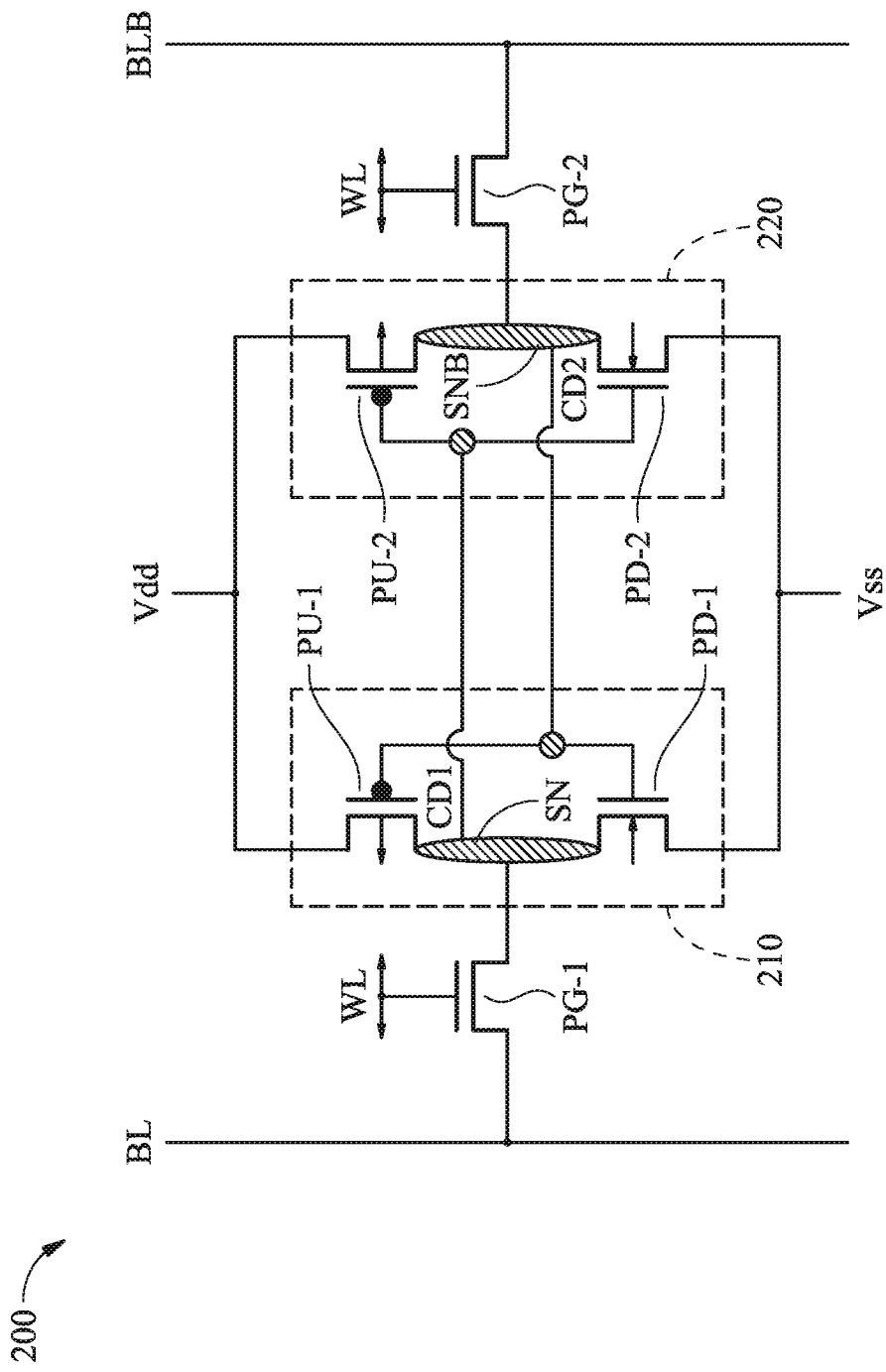
FIG. 2 is a circuit diagram of a single-port SRAM cell, which can be implemented in a memory cell of a memory macro, according to various aspects of the present disclosure.

FIG. 2 is a circuit diagram of a single-port SRAM cell 200, which can be implemented in a memory cell of a SRAM array, according to various aspects of the present disclosure. In some implementations, SRAM cell 200 is implemented in one or more memory cells 106 of memory macro 102 (FIG. 1). FIG. 2 has been simplified for the sake of clarity to better understand the inventive concepts of the present disclosure. Additional features can be added in single-port SRAM cell 200, and some of the features described below can be replaced, modified, or eliminated in other embodiments of single-port SRAM cell 200.

Single-port SRAM cell 200 includes six transistors: a pass-gate transistor PG-1, a pass-gate transistor PG-2, a pull-up transistor PU-1, a pull-up transistor PU-2, a pull-down transistor PD-1, and a pull-down transistor PD-1. Single-port SRAM cell 200 is thus alternatively referred to as a 6T SRAM cell. In operation, pass-gate transistor PG-1 and pass-gate transistor PG-2 provide access to a storage portion of SRAM cell 200, which includes a cross-coupled pair of inverters, an inverter 210 and an inverter 220. Inverter 210 includes pull-up transistor PU-1 and pull-down transistor PD-1, and inverter 220 includes pull-up transistor PU-2 and pull-down transistor PD-2. In some implementations, pull-up transistors PU-1, PU-2 are configured as p-type FinFETs, and pull-down transistors PD-1, PD-2 are configured as n-type FinFETs. For example, pull-up transistors PU-1, PU-2 each include a gate structure disposed over a channel region of an n-type fin structure (including one or more n-type fins), such that the gate structure interposes p-type source/drain regions of the n-type fin structure (for example, p-type epitaxial source/drain features), where the gate structure and the n-type fin structure are disposed over an n-type well region; and pull-down transistors PD-1, PD-2 each includes a gate structure disposed over a channel region of a p-type fin structure (including one or more p-type fins), such that the gate structure interposes n-type source/drain regions of the p-type fin structure (for example, n-type epitaxial source/drain features), where the gate structure and the p-type fin structure are disposed over a p-type well region. In some implementations, pass-gate transistors PG-1, PG-2 are also configured as n-type FinFETs. For example, pass-gate transistors PG-1, PG-2 each include a gate structure disposed over a channel region of a p-type fin structure (including one or more p-type fins), such that the gate structure interposes n-type source/drain regions of the p-type fin structure (for example, n-type epitaxial source/drain features), where the gate structure and the p-type fin structure are disposed over a p-type well region.

A gate of pull-up transistor PU-1 interposes a source (electrically coupled with a power supply voltage ($V_{DD}$)) and a first common drain (CD1), and a gate of pull-down transistor PD-1 interposes a source (electrically coupled with a power supply voltage ($V_{SS}$)) and the first common drain. A gate of pull-up transistor PU-2 interposes a source (electrically coupled with power supply voltage ($V_{DD}$)) and a second common drain (CD2), and a gate of pull-down transistor PD-2 interposes a source (electrically coupled with power supply voltage ($V_{SS}$)) and the second common drain. In some implementations, the first common drain (CD1) is a storage node (SN) that stores data in true form, and the second common drain (CD2) is a storage node (SNB) that stores data in complementary form. The gate of pull-up transistor PU-1 and the gate of pull-down transistor PD-1 are coupled with the second common drain, and the gate of pull-up transistor PU-2 and the gate of pull-down transistor PD-2 are coupled with the first common drain. A gate of pass-gate transistor PG-1 interposes a source (electrically coupled with a bit line BL) and a drain, which is electrically coupled with the first common drain. A gate of pass-gate transistor PG-2 interposes a source (electrically coupled with a complementary bit line BLB) and a drain, which is electrically coupled with the second common drain (CD2). The gates of pass-gate transistors PG-1, PG-2 are electrically coupled with a word line WL. In some implementations, pass-gate transistors PG-1, PG-2 provide access to storage nodes SN, SNB during read operations and/or write operations. For example, pass-gate transistors PG-1, PG-2 couple storage nodes SN, SNB respectively to bit lines BL, BLB in response to voltage applied to the gates of pass-gate transistors PG-1, PG-2 by WLs.

Figure 3:
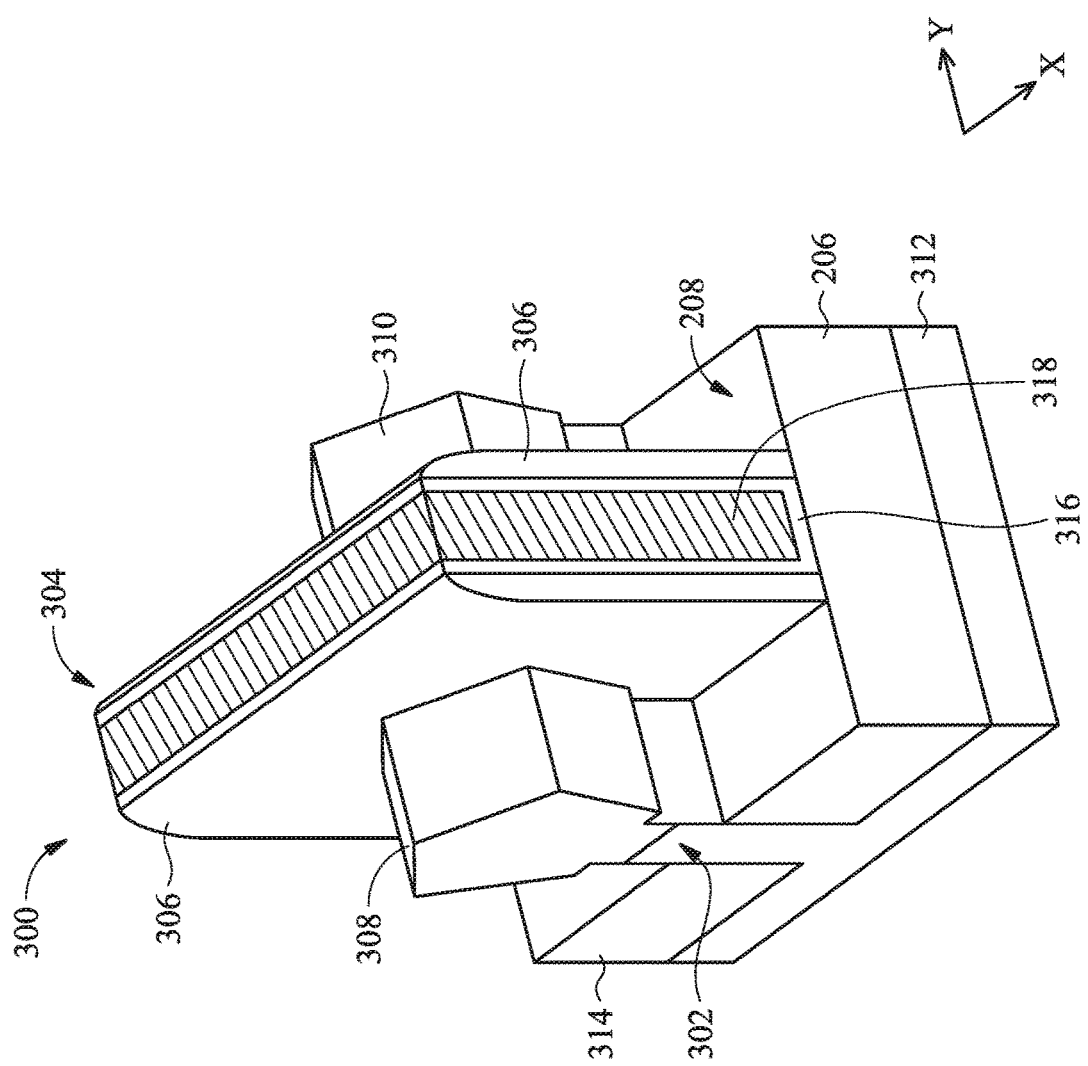
FIG. 3 is a perspective view of a fin field-effect transistor (FinFET) in accordance with some embodiments.

FIG. 3 illustrates a perspective view of a fin field effect transistor (FinFET) 300, which may serve as any of the transistors in single-port SRAM cell 200 (FIG. 2), including pull-up transistor PU-1, pull-up transistor PU-2, pull-down transistor PD-1, pull-down transistor PD-2, pass-gate transistor PG-1, and pass-gate transistor PG-2. In some embodiments, FinFET 300 includes a semiconductor fin 302, a gate structure 304, spacers 306, a drain region 308, and a source region 310. Semiconductor fin 302 extends above a semiconductor substrate 312. In some embodiments, semiconductor substrate 312 and semiconductor fin 302 are made of the same material. For example, the substrate is a silicon substrate. In some instances, the substrate includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some embodiments, the substrate is a silicon on insulator (SOI) layer substrate or a silicon on sapphire (SOS) substrate. In some embodiments, semiconductor substrate 312 and semiconductor fin 302 are made of different materials.

Semiconductor fin 302 may be patterned by any suitable method. For example, semiconductor fin 302 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern semiconductor fin 302.

In some embodiments, semiconductor fin 302 of FinFET 300 may be surrounded by isolating features 314 formed on opposite sides of semiconductor fin 302. Isolating features 314 may electrically isolate an active region (not shown) of FinFET 300 from other active regions. In some embodiments, isolating features 314 are shallow trench isolation (STI), field oxide (FOX), or another suitable electrically insulating structure. For example, semiconductor fin 302 represents semiconductor fins 520A, 520B, 520C, 520D, 520E, and 520F in a layout of a SRAM cell 400 shown in FIG. 4.

Still referring to FIG. 3, in some embodiments, gate structure 304, which includes a gate dielectric 316 and a gate electrode 318 formed over gate dielectric 316, is positioned over sidewalls and a top surface of semiconductor fin 302. Therefore, a portion of semiconductor fin 302 overlaps gate structure 304 may serve as a channel region of FinFET 300. In some embodiments, gate dielectric 316 is a high dielectric constant (high-k) dielectric material. A high-k dielectric material has a dielectric constant (k) higher than that of silicon dioxide. Examples of high-k dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the gate electrode 318 is made of a conductive material, such as aluminum (Al), copper (Cu), tungsten (W), titanium (Ti), tantalum (Ta), or another applicable material.

In some embodiments, spacers 306 of FinFET 300 are positioned over sidewalls and a top surface of semiconductor fin 302. In addition, spacers 306 may be formed on opposite sides of gate structure 304. In some embodiments, spacers 306 are made of silicon nitride, silicon oxynitride, silicon carbide, another suitable material, or a combination thereof.

In some embodiments, portions of semiconductor fin 302 that are not covered by gate structure 304 and spacers 306 serve as a drain region 308 and a source region 310. In some embodiments, drain region 308 and source region 310 of p-type FinFETs, for example, pull-up transistor PU-1 and pull-up transistor PU-2 are formed by implanting the portions of semiconductor fin 302 that are not covered by gate structure 304 and spacers 306 with a p-type impurity such as boron, indium, or the like. In some embodiments, drain region 308 and source region 310 of n-type FinFETs, for example, pass-gate transistor PG-1, pass-gate transistor PG-2, pull-down transistor PD-1, and pull-down transistor PD-2 are formed by implanting the portions of semiconductor fin 302 that are not covered by gate structure 304 and spacers 306 with an n-type impurity such as phosphorous, arsenic, antimony, or the like.

In some embodiments, drain region 308 and source region 310 are formed by etching portions of semiconductor fin 302 that are not covered by gate structure 304 and spacers 306 to form recesses, and growing epitaxial regions in the recesses. The epitaxial regions may be formed of Si, Ge, SiP, SiC, SiPC, SiGe, SiAs, InAs, InGaAs, InSb, GaAs, GaSb, InAlP, InP, C, or a combination thereof. Accordingly, drain region 308 and source region 310 may be formed of silicon germanium (SiGe) in some exemplary embodiments, while the remaining semiconductor fin 302 may be formed of silicon. In some embodiments, p-type impurities are in-situ doped in drain region 308 and source region 310 during the epitaxial growth of drain region 308 and source region 310 of p-type FinFET 300, for example, pull-up transistor PU-1 and pull-up transistor PU-2 in FIG. 2. In addition, n-type impurities are in-situ doped in drain region 308 and source region 310 during the epitaxial growth of drain region 308 and source region 310 of n-type FinFET 300, for example, pass-gate transistor PG-1, pass-gat transistor PG-2, pull-down transistor PD-1, and pull-down transistor PD-2 in FIG. 2.

In some other embodiments, pass-gate transistors PG-1 and PG-2, pull-up transistors PU-1 and PU-2, and pull-down transistors PD-1 and PD-2 of SRAM cell 200 in FIG. 2 are planar MOS devices.

Figure 4:
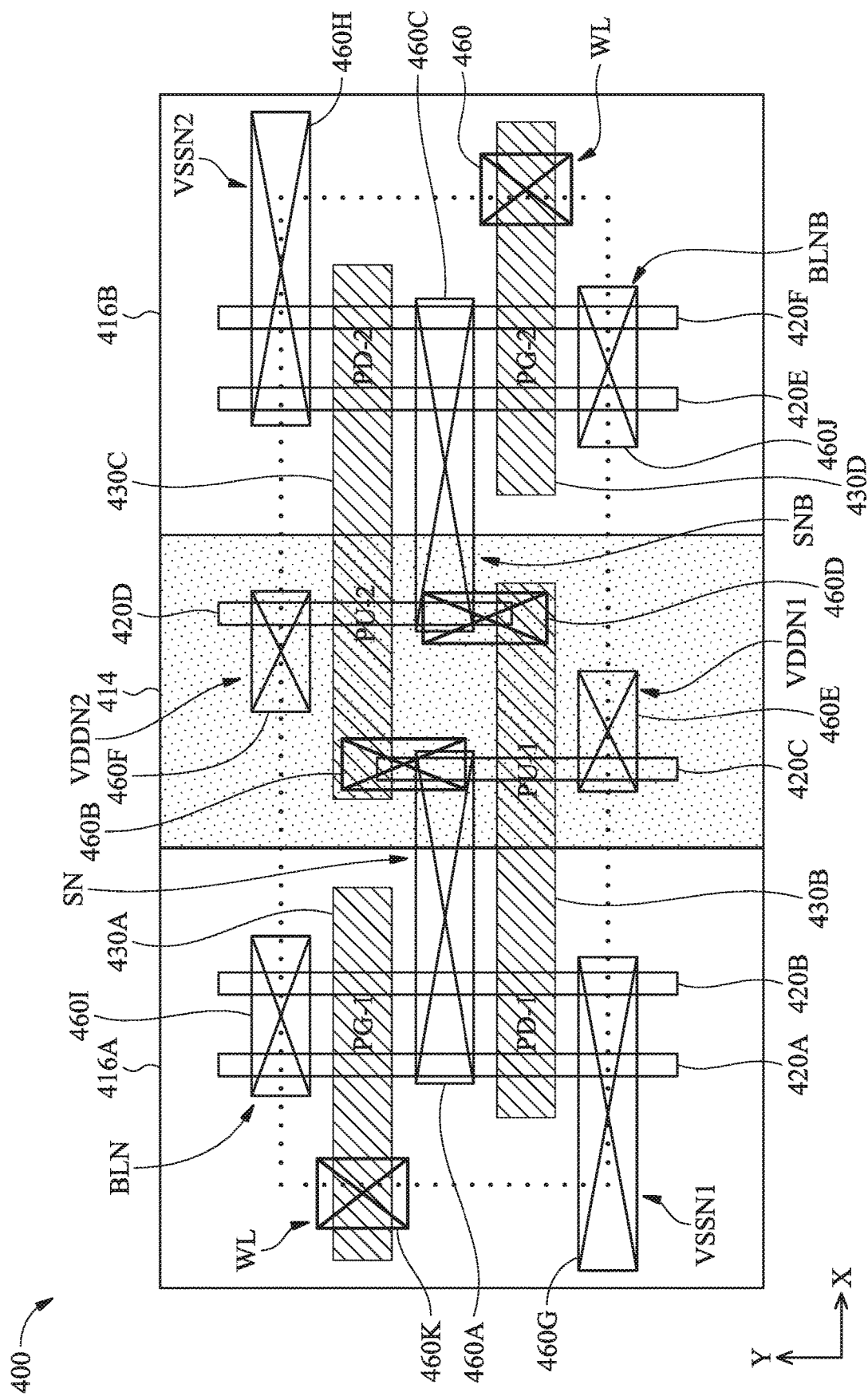
FIG. 4 is a plan view of a single-port SRAM cell, which can be implemented in a memory cell of a memory macro, according to various aspects of the present disclosure.

FIG. 4 is a layout of a single-port SRAM cell 400, which can be implemented in a memory cell of a SRAM array, according to various aspects of the present disclosure. In some implementations, SRAM cell 400 is implemented in one or more memory cells 106 of memory macro 102 (FIG. 1), or as single-port SRAM cell 200 (FIG. 2). FIG. 4 has been simplified for the sake of clarity to better understand the inventive concepts of the present disclosure. Additional features can be added in single-port SRAM cell 400, and some of the features described below can be replaced, modified, or eliminated in other embodiments of single-port SRAM cell 400.

In FIG. 4, single-port SRAM cell 400 includes six transistors: a pass-gate transistor PG-1, a pass-gate transistor PG-2, a pull-up transistor PU-1, a pull-up transistor PU-2, a pull-down transistor PD-1, and a pull-down transistor PD-2. Single-port SRAM cell 400 is thus alternatively referred to as a 6T SRAM cell. Single-port SRAM cell 400 includes an n-well 414 disposed between a p-well 416A and a p-well 416B. Pull-up transistors PU-1, PU-2 are disposed over n-well 414; pull-down transistor PD-1 and pass-gate transistor PG-1 are disposed over p-well 416A; and pull-down transistor PD-2 and pass-gate transistor PG-2 are disposed over p-well 416B. In some implementations, pull-up transistors PU-1, PU-2 are configured as p-type FinFETs, and pull-down transistors PD-1, PD-2 and pass-gate transistors PG-1, PG-2 are configured as n-type FinFETs. In some embodiments, each transistor may be in a form similar to FinFET 300 (FIG. 3). In the illustrated embodiment, pull-down transistor PD-1 and pass-gate transistor PG-1 are multi-fin FinFETs (including, for example, a fin 420A and a fin 420B), pull-up transistor PU-1 is a single fin FinFET (including, for example, a fin 420C), pull-up transistor PU-2 is a single fin FinFET (including, for example, a fin 420D), and pull-down transistor PD-2 and pass-gate transistor PG-2 are multi-fin FinFETs (including, for example, a fin 420E and a fin 420F). Fin 420A, fin 420B, fin 420E, and fin 420F are p-type doped fins, and fin 420C and fin 420D are n-type doped fins. A gate structure 430A is disposed over fins 420A, 420B; a gate structure 430B is disposed over fins 420A-420D; a gate structure 430C is disposed over fins 420C-420F; and a gate structure 430D is disposed over fins 420E, 420F. A gate of pass-gate transistor PG-1 is formed from gate structure 430A, a gate of pull-down transistor PD-1 is formed from gate structure 430B, a gate of pull-up transistor PU-1 is formed from gate structure 430B, a gate of pull-up transistor PU-2 is formed from gate structure 430C, a gate of pull-down transistor PD-2 is formed from gate structure 430C, and a gate of pass-gate transistor PG-2 is formed from gate structure 430D.

A device-level contact 460A electrically connects a drain region of pull-down transistor PD-1 (formed by fins 420A, 420B (which can include n-type epitaxial source/drain features)) and a drain region of pull-up transistor PU-1 (formed by fin 420C (which can include p-type epitaxial source/drain features)), such that a common drain of pull-down transistor PD-1 and pull-up transistor PU-1 form a storage node SN. A device-level contact 460B electrically connects a gate of pull-up transistor PU-2 (formed by gate structure 430C) and a gate of pull-down transistor PD-2 (also formed by gate structure 430C) to storage node SN. A device-level contact 460C electrically connects a drain region of pull-down transistor PD-2 (formed by fins 420E, 420F (which can include n-type epitaxial source/drain features)) and a drain region of pull-up transistor PU-2 (formed by fin 420D (which can include p-type epitaxial source/drain features)), such that a common drain of pull-down transistor PD-2 and pull-up transistor PU-2 form a storage node SNB. A device-level contact 460D electrically connects a gate of pull-up transistor PU-1 (formed by gate structure 430B) and a gate of pull-down transistor PD-1 (also formed by gate structure 430B) to storage node SNB. A device-level contact 460E electrically connects a source region of pull-up transistor PU-1 (formed by fin 420C (which can include p-type epitaxial source/drain features)) to a power supply voltage $V_{DD}$ at a voltage node VDDN1, and a device-level contact 460F electrically connects a source region of pull-up transistor PU-2 (formed by fin 420D (which can include p-type epitaxial source/drain features)) to power supply voltage $V_{DD}$ at a voltage node VDDN2. A device-level contact 460G electrically connects a source region of pull-down transistor PD-1 (formed by fins 420A, 420B (which can include n-type epitaxial source/drain features)) to a power supply voltage $V_{SS}$ at a voltage node VSSN1, and a device-level contact 460H electrically connects a source region of pull-down transistor PD-2 (formed by fins 420E, 420F (which can include n-type epitaxial source/drain features)) to power supply voltage $V_{SS}$ at a voltage node VSSN2. A device-level contact 460I electrically connects a source region of pass-gate transistor PG-1 (formed by fins 420A, 420B (which can include n-type epitaxial source/drain features)) to a bit line (generally referred to as a bit line node BLN), and a device-level contact 460J electrically connects a source region of pass-gate transistor PG-2 (formed by fins 420E, 420F (which can include n-type epitaxial source/drain features)) to a complementary bit line (generally referred to as a bit line node BLNB). A device-level contact 460K electrically connects a gate of pass-gate transistor PG-1 (formed by gate structure 430A) to a word line WL (generally referred to as a word line node WL), and a device-level contact 460L electrically connects a gate of pass-gate transistor PG-2 (formed by gate structure 430D) to the word line. Though not depicted, it is understood that single-port SRAM cell 400 can further include vias and/or conductive lines of a multilayer interconnect (MLI) feature electrically connected to device-level contacts 460A-460K.

Figure 5:
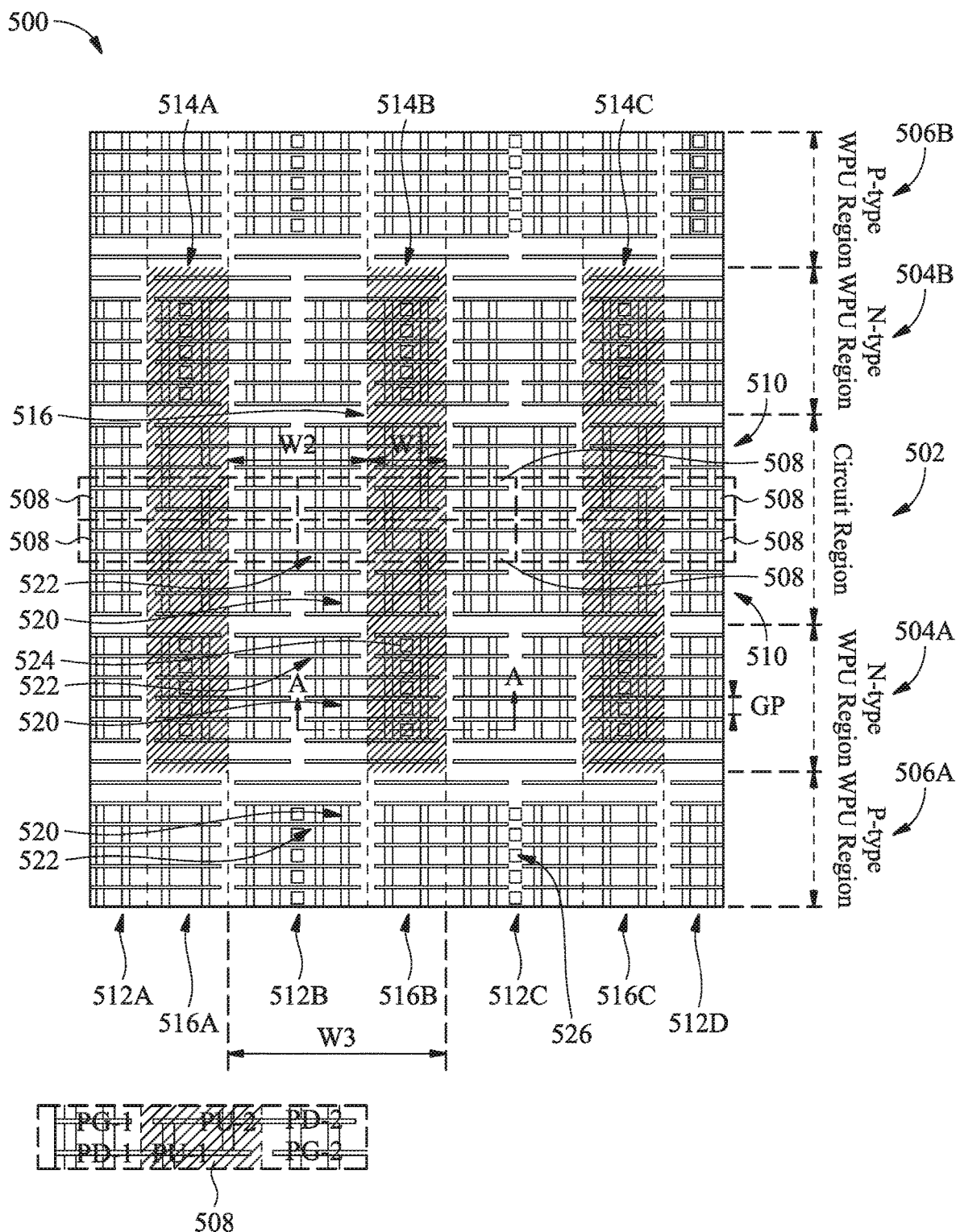
FIGS. 5, 7, 8, and 9 are fragmentary plan views of a portion of a memory array according to various aspects of the present disclosure.

FIG. 5 is a fragmentary top view of a portion of a SRAM array 500 in one embodiment of the present disclosure. In some implementations, the portion of SRAM array 500 represents a portion of memory macro 102 (FIG. 1). FIG. 5 has been simplified for the sake of clarity to better understand the inventive concepts of the present disclosure. For example, device-level contacts in a SRAM cell as described above in association with FIG. 4 are omitted. Additional features can be added in SRAM array 500, and some of the features described below can be replaced, modified, or eliminated in other embodiments of SRAM array 500.

SRAM array 500 includes a circuit region 502, n-type WPU regions 504A and 504B (collectively, as n-type WPU regions 504), and p-type WPU regions 506A and 506B (collectively as p-type WPU regions 506). Circuit region 502 includes multiple memory bit cells, such as SRAM cells 508 over n-wells and p-wells. Circuit region 502 is also referred to as memory bit cell region 502. N-type WPU regions 504 provide n-well pick-up areas to electrically couple a bias voltage to n-wells. P-type WPU regions 506 provide p-well pick-up areas to electrically couple a bias voltage to p-wells. Circuit region 502, n-type WPU regions 504, and p-type WPU regions 506, all oriented lengthwise along an x-direction in the depicted embodiment. N-type WPU region 504A and p-type WPU region 506A are on one side of circuit region 502 with n-type WPU region 504A between circuit region 502 and p-type WPU region 506A. N-type WPU region 504B and p-type WPU region 506B are on an opposing side of circuit region 502 with n-type WPU region 504B between circuit region 502 and p-type WPU region 506B.

Circuit region 502 includes p-wells 512A, 512B, 512C, 512D (collectively, as p-wells 512) and n-wells 514A, 514B, 514C (collectively, as n-wells 514) alternately arranged along an x-direction. In other words, every p-well 512 is next to an n-well 514 which is next to another p-well 512, and this pattern repeats. An n-well 514 has a width denoted as W1, and a p-well 512 has a width denoted as W2. Generally, W1 is smaller than W2. A well boundary 516 is formed between any two oppositely doped wells. Every p-well 512 and n-well 514 further extends continuously into adjacent n-type WPU regions 504 lengthwise along an y-direction. N-wells 514 do not further extend into p-type WPU regions 506, while p-wells 512 further extend into p-type WPU regions 506. In p-type WPU regions 506, p-wells 512 expands laterally along an x-direction to connect with a neighboring p-wells. For example, p-well 512A extends with a p-well linking portion 516A to connect with p-well 512B, p-well 512B extends with a p-well linking portion 516B to connect with p-well 512C, and p-well 512C extends with a p-well linking portion 512C to connect with p-well 512D. With a p-well linking portion, a p-well 512's width expands from W2 to W3 (W3=W1+W2) in p-type WPU regions 506. Since all p-wells 512 are connected in p-type WPU regions, they can also be regarded as portions of one single larger p-well that surrounds n-wells 514A, 514B, 514C.

Over the wells, circuit region 502 includes active regions 520 oriented lengthwise generally along an y-direction, and gate structures 522 oriented lengthwise generally along an x-direction. The active regions 520 are properly doped for forming transistors. For example, active regions 520 over p-wells 512 are doped with n-type dopants for forming n-type FETs, and active regions 520 over n-wells 516 are doped with p-type dopants for forming p-type FETs. Active regions 520 may include fins or fin active regions for FinFETs in an embodiment (similar to FinFET 300 described above with reference to FIG. 3) or may include vertically stacked multiple nanowires or nanosheets for gate-all-around (GAA) FETs in another embodiment. Active regions 520 may take other suitable forms or shapes (such as planar active regions for planar MOSFETs). Gate structures 522 may include high-k metal gate (HK/MG) structures (i.e., having one or more metal layers over a high-k gate dielectric layer) in an embodiment, and may include other materials and/or configuration in various embodiments. Gate structures 522 engage active regions 520 to form various transistors, such as n-type FinFETs, p-type FinFETs, n-type GAA FETs, and p-type GAA FETs. The transistors are properly coupled to form memory bits, such as SRAM cells. In the depicted embodiment, six SRAM cells 508 (highlighted in dotted boxes in FIG. 5) of two rows and three columns are illustrated, which is provided for illustration purposes and does not necessarily limit the embodiments of the present disclosure to any other number of rows and any other number of columns of memory bit cells. For example, the structures shown in FIG. 5 may be repeated along the x-direction to increase number of columns of memory cells. Each of SRAM cells 508 may include a single-port SRAM, a dual-port SRAM, other type SRAM, or combinations thereof. For example, SRAM cells 508 include single-port SRAMs. In the depicted embodiment, although labeled on only one SRAM cell 508, each of SRAM cells 508 include six transistors: a pass-gate transistor PG-1, a pass-gate transistor PG-2, a pull-up transistor PU-1, a pull-up transistor PU-2, a pull-down transistor PD-1, and a pull-down transistor PD-2 (similar to single-port SRAM cell 400 described above with reference to FIG. 4). Circuit region 502 also includes dummy areas 510 disposed between the edge of SRAM cells 508 and n-type WPU region 504.

N-type WPU regions 504 and p-type WPU regions 506 also includes active regions 520 over the p-wells and n-wells. Active regions 520 in the WPU regions may have the same shape and configuration as active regions 520 in circuit region 502. For example, active regions 520 over p-wells may be doped with n-type dopants, and active regions 520 over n-wells may be doped with p-type dopants. Active regions 520 are oriented lengthwise generally along an y-direction. Particularly, active regions 520 in the WPU regions are aligned with active regions 520 in circuit region 502 along the y-direction. But they are separate from each other. In some embodiments, a fin formation process first forms fins extending continuously through p-type WPU region 506A, n-type WPU region 504A, circuit region 502, n-type WPU region 504B, p-type WPU region 506B in sequence, followed by a fin cut process that subsequently divides each fin into separated segments in each respective region. The separation is provided for effectively isolating active fin segments' functionality in circuit region 502 from interference created by other fin segments in WPU regions.

N-type WPU regions 504 and p-type WPU regions 506 further includes gate structures 522 oriented lengthwise generally along an x-direction. The gate structures 522 in the WPU regions may have the same shape and configuration as gate structures 522 in circuit regions 502. For example, gate structures 522 may include high-k metal gate (HK/MG) structures in an embodiment and may include other materials and/or configuration in various embodiments.

N-type WPU regions 504 further includes contact features 524 disposed over and in electrical contact with n-wells 514, and p-type WPU regions 506 further includes contact features 526 disposed over and in electrical contact with p-wells 512. Contact features 524 and 526 are part of well pick-up structures, through which wells 512 and 514 receive voltages (or biasing) from tester equipment or other circuits. In the depicted embodiment, contact features 524 are disposed near the middle of each n-well 514 and between two active regions 520 over the respective n-well 514, and contact features 526 are disposed near the middle of each p-well 512 and between two active regions 520 over the respective p-well 512. There are no contact features 526 for p-well pick-up structures over either p-wells 512 in the n-type WPU region 504 or p-well linking portions 516 in p-type WPU regions 516. Accordingly, contact features 524 and 526 are spaced out along both the x-direction (e.g., by at least 3 gate pitches) and the y-direction (e.g., by at least 3 gate pitches) for effective isolation between them. Further, the number of the contact features over each well is designed to strike a balance between providing a low well pick-up resistance and costing low. The number of contact features over each of the wells affects the resistance of the well pick-up structure on the respective well. Having a greater number of contact features advantageously reduces the resistance of the well pick-up structure. However, it also takes up more chip areas, which means a higher cost. In some embodiments, the number of rows of the contact features 526 along an y-direction over each p-well 512 on one side of the circuit region 502 is designed to be in a range of 2 to 10 to provide low enough resistance but also be cost effective, such as 5 in the depicted embodiment. For the same reason, the number of rows of the contact features 524 along an y-direction over each n-well 514 on one side of the circuit region 502 is designed to be in a range of 2 to 10, such as 5 (e.g., equal to that of the contact features 526) in the depicted embodiment. In each WPU region, over each n-well 514 or p-well 512, the number of rows of the contact features 524 or contact features 526 may be less than the number of gate structures 522, such as one less.

Figure 6:
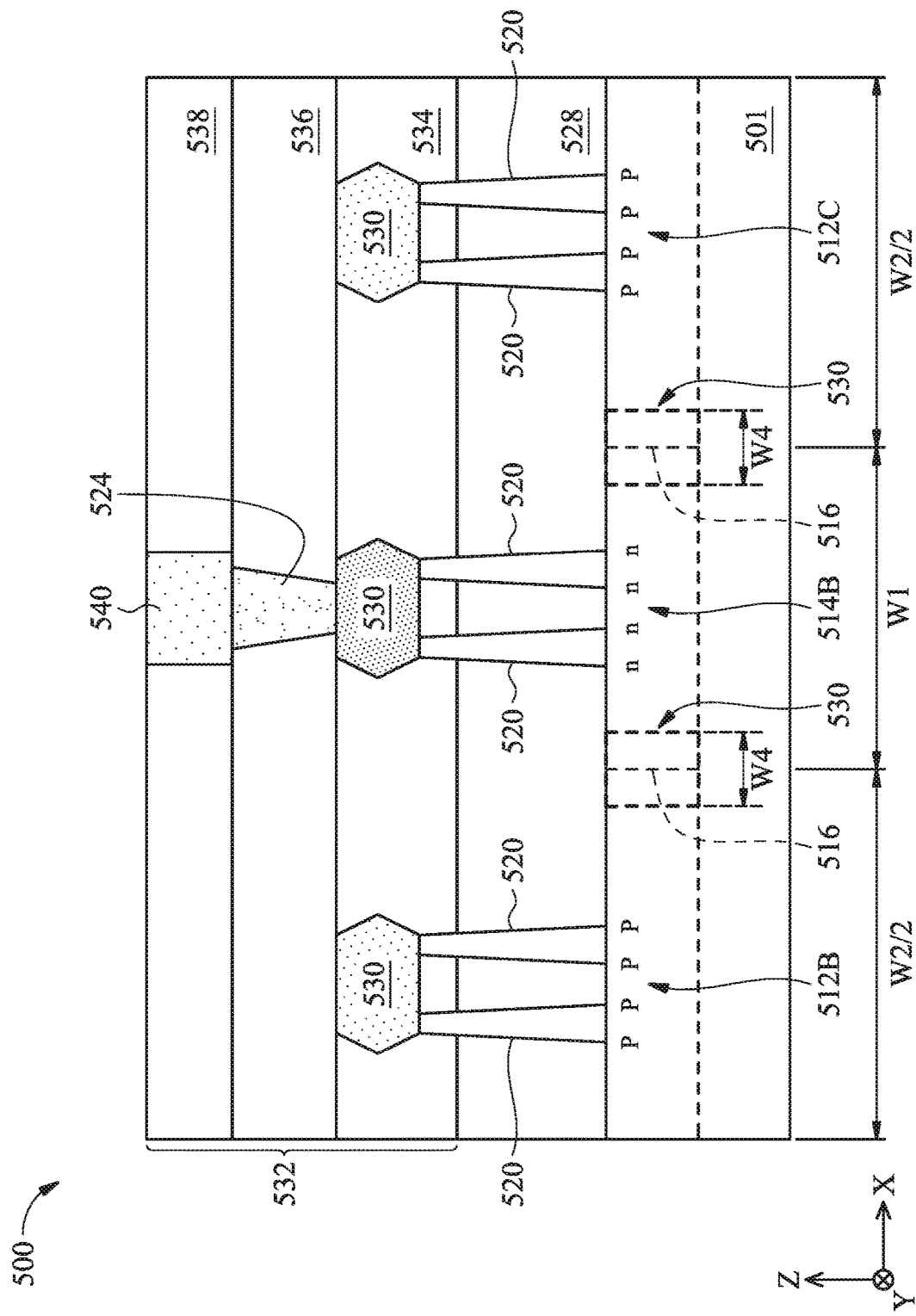
FIG. 6 is a fragmentary diagrammatic view of a portion of a memory array according to various aspects of the present disclosure.

FIG. 6 shows a partial, cross-sectional view of SRAM array 500 in the n-type WPU region 504A along the A-A line in FIG. 5. The device 500 includes a substrate 501. The n-well 514B and p-wells 512B and 512C are formed in and/or on the substrate 501. Referring to FIG. 6, only half width W2 (W2/2) of p-wells 512B and 512C are shown. The active regions 520 are formed as fins over the substrate 501 in this embodiment (also referred to as fins 520). The device 500 further includes an isolation structure 528 disposed over the substrate 501 and laterally between the fins 520.

Substrate 501 is a silicon substrate in the depicted embodiment. Alternatively, substrate 501 may comprise another elementary semiconductor, such as germanium; a compound semiconductor including silicon carbide, gallium arsenide, gallium phosphide, indium phosphide, indium arsenide, and indium antimonide; an alloy semiconductor including silicon germanium, gallium arsenide phosphide, aluminum indium phosphide, aluminum gallium arsenide, gallium indium arsenide, gallium indium phosphide, and gallium indium arsenide phosphide; or combinations thereof.

Fins 520 may comprise the same semiconductor material(s) as substrate 501. In an embodiment, fins 520 may include alternately stacked layers of two different semiconductor materials, such as layers of silicon and silicon germanium alternately stacked. Fins 520 may include n-type dopant(s) such as phosphorus or arsenic, or p-type dopant(s) such as boron or indium. For example, active regions 520 over p-wells may be doped with n-type dopants, and active regions 520 over n-wells may be doped with p-type dopants. Fins 520 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern fins 520 by etching the initial epitaxial semiconductor layers. The etching process can include dry etching, wet etching, reactive ion etching (RIE), and/or other suitable processes. For example, a dry etching process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etching process may comprise etching in diluted hydrofluoric acid (DHF); potassium hydroxide (KOH) solution; ammonia; a solution containing hydrofluoric acid (HF), nitric acid ($HNO_3$), and/or acetic acid ($CH_3COOH$); or other suitable wet etchant.

Isolation structure 528 may comprise silicon oxide, silicon nitride, silicon oxynitride, fluoride-doped silicate glass (FSG), a low-k dielectric material, and/or other suitable insulating material. Isolation structure 528 may be shallow trench isolation (STI) features. Other isolation structure such as field oxide, LOCal Oxidation of Silicon (LOCOS), and/or other suitable structures are possible. Isolation structure 528 may include a multi-layer structure, for example, having one or more thermal oxide liner layers adjacent to fins 520.

Epitaxial source features and epitaxial drain features (referred to as epitaxial source/drain features) are disposed over the source/drain regions of fins 520. For example, semiconductor material is epitaxially grown on fins 520, forming epitaxial source/drain features 530. In some implementations, epitaxial source/drain features 530 are formed over the source/drain regions of fins 520 after a fin recess process (for example, an etch back process), such that epitaxial source/drain features 530 are grown from recessed fins. In some implementations, epitaxial source/drain features 530 wrap the source/drain regions of fins 520. In such implementations, fins 520 may not be subjected to a fin recess process. In the depicted embodiment, epitaxial source/drain features 530 extend (grow) laterally along the x-direction (in some implementations, substantially perpendicular to fins 520), such that epitaxial source/drain features 530 are merged epitaxial source/drain features that span more than one fin. For example, over n-well 514B, epitaxial source/drain feature 530 spans two fins 520. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. The epitaxy process can use gaseous and/or liquid precursors, which interact with the composition of substrate 501. Epitaxial source/drain features 530 are doped with n-type dopants and/or p-type dopants. Epitaxial source/drain features 530 over p-well and n-well are oppositely doped. In the depicted embodiment, epitaxial source/drain features 530 over p-wells 512B and 512C are silicon germanium containing epitaxial layers doped with boron, carbon, other p-type dopant, or combinations thereof (for example, forming a Si:Ge:B epitaxial layer or a Si:Ge:C epitaxial layer). Epitaxial source/drain feature 530 over n-well 514B is silicon-carbon-containing epitaxial layers are doped with phosphorous, arsenic, other n-type dopant, or combinations thereof (for example, forming a Si:P epitaxial layer, a Si:C epitaxial layer, or a Si:C:P epitaxial layer).

In some implementations, silicide layers are formed on epitaxial source/drain features 530. In some implementations, silicide layers are formed by depositing a metal layer over epitaxial source/drain features 530. The metal layer includes any material suitable for promoting silicide formation, such as nickel, platinum, palladium, vanadium, titanium, cobalt, tantalum, ytterbium, zirconium, other suitable metal, or combinations thereof. A heating process, such as an annealing process is subsequently performed to cause constituents of epitaxial source/drain features 530 (for example, silicon and/or germanium) to react with the metal. Silicide layers thus include metal and a constituent of epitaxial source/drain features 530 (for example, silicon and/or germanium). In some implementations, silicide layers include nickel silicide, titanium silicide, or cobalt silicide. Any un-reacted metal, such as remaining portions of the metal layer, is selectively removed by any suitable process, such as an etching process. In some implementations, the silicide layers and epitaxial source/drain features 530 are collectively referred to as the epitaxial source/drain features.

A multilayer interconnect (MLI) feature 532 is disposed over substrate 501. MLI feature 532 electrically couples various devices (for example, transistors, resistors, capacitors, and/or inductors) and/or components (for example, gate structures and/or source/drain features), such that the various devices and/or components can operate as specified by design requirements of SRAM array 500. MLI feature 532 includes a combination of dielectric layers and electrically conductive layers (for example, metal layers) configured to form various interconnect structures. The conductive layers are configured to form vertical interconnect features, such as device-level contacts and/or vias, and/or horizontal interconnect features, such as conductive lines. Vertical interconnect features typically connect horizontal interconnect features in different layers (or different planes) of MLI feature 532. It is noted that though MLI feature 532 is depicted with a given number of dielectric layers and conductive layers, the present disclosure contemplates MLI feature 532 having more or less dielectric layers and/or conductive layers.

MLI feature 532 includes one or more dielectric layers, such as an interlayer dielectric layer 534 (ILD-0) disposed over substrate 501, an interlayer dielectric layer 536 (ILD-1) disposed over ILD layer 534, and an interlayer dielectric layer 538 (ILD-2) disposed over ILD layer 536. ILD layers 534, 536, and 538 include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK® (Dow Chemical, Midland, Michigan), polyimide, other low-k dielectric material, or combinations thereof. In the depicted embodiment, ILD layers 534, 536, and 538 are dielectric layers that include a low-k dielectric material (generally referred to as low-k dielectric layers). In some implementations, low-k dielectric material generally refers to materials having a dielectric constant (k) that is less than 3. ILD layers 534, 536, and 538 can include a multilayer structure having multiple dielectric materials. ILD layers 534, 536, and 538 are formed over substrate 501 by a deposition process, such as CVD, PVD, ALD, HDPCVD, MOCVD, RPCVD, PECVD, LPCVD, ALCVD, APCVD, plating, other suitable methods, or combinations thereof. In some implementations, ILD layers 534, 536, and 538 are formed by a flowable CVD (FCVD) process that includes, for example, depositing a flowable material (such as a liquid compound) over substrate 501 and converting the flowable material to a solid material by a suitable technique, such as thermal annealing and/or ultraviolet radiation treating. Subsequent to the deposition of ILD layers 534, 536, and 538, a CMP process and/or other planarization process is performed, such that ILD layers 534, 536, and 538 have substantially planar surfaces.

A contact 524 and a conductive line 540 (such as metal 1) are disposed in ILD layers 536 and 538 to form interconnect structures. In some implementations, MLI feature 532 further includes vias interposed between contact 524 and conductive line 540. Contact 524 and conductive line 540 include any suitable electrically conductive material, such as Ta, Ti, Al, Cu, Co, W, TiN, TaN, other suitable conductive materials, or combinations thereof. In some implementations, contact 524 include Ti, TiN, and/or Co and conductive line 540 include Cu, Co, and/or Ru. Contact 524 electrically couples n-well 514B to conductive line 540, which in turn connects to bias voltages (such as Vdd or Vss depicted in FIG. 2). As discussed above, contact features for p-well pick-up structures are all in p-type WPU regions 506, there are no contacts over either p-wells 512B or 512C in the n-type WPU regions 504.

Still referring to FIG. 6, in substrate 501, n-well 514B is next to p-well 512B and p-well 512C. Well boundaries 516 as an interface between a pair of two oppositely doped wells are indicated with dashed lines. In a proximity region around each well boundary 516, dopants in two oppositely doped wells diffuse into each other, forming a diffusion area 530 indicated with a dotted box. Inside diffusion area 530, opposite dopants from n-well and p-well neutralize, resulting in a high resistant area along well boundary 516. A width of diffusion area 530 is denoted as W4. Diffusion area 530 reduces equivalent width of n-well 514B from W1 down to W1−W4. Similarly, diffusion area 530 reduces equivalent width of p-well 512B or p-well 512C from W2 down to W2−W4. In some embodiments, W1−W4 is about half of W1. With reduced equivalent well width, resistances at bottom of n-well and p-well both increase. Since in SRAM array 500, n-wells are generally narrower than p-wells, equivalent width reduction has more impact on n-wells than p-wells. Further, since p-well pick-up structures are in p-type WPU region 506 that is free of diffusion areas, reduction of well equivalent width in n-type WPU regions 504 does not impact p-well pick-up structures' resistance as much as n-well pick-up structures. In some cases, n-well pick-up structure's resistance may be increased one or two orders higher with the existence of diffusion area 530. In a specific example, the existence of diffusion area 530 may significantly increase n-well pick-up structure's resistance, such as about 10 times larger. Higher n-well pick-up structure's resistance also triggers latch-up more easily. To mitigate n-well equivalent width reduction, one option is to increase n-well width in n-type WPU regions 504, which is discussed in further details below.

Figure 7:
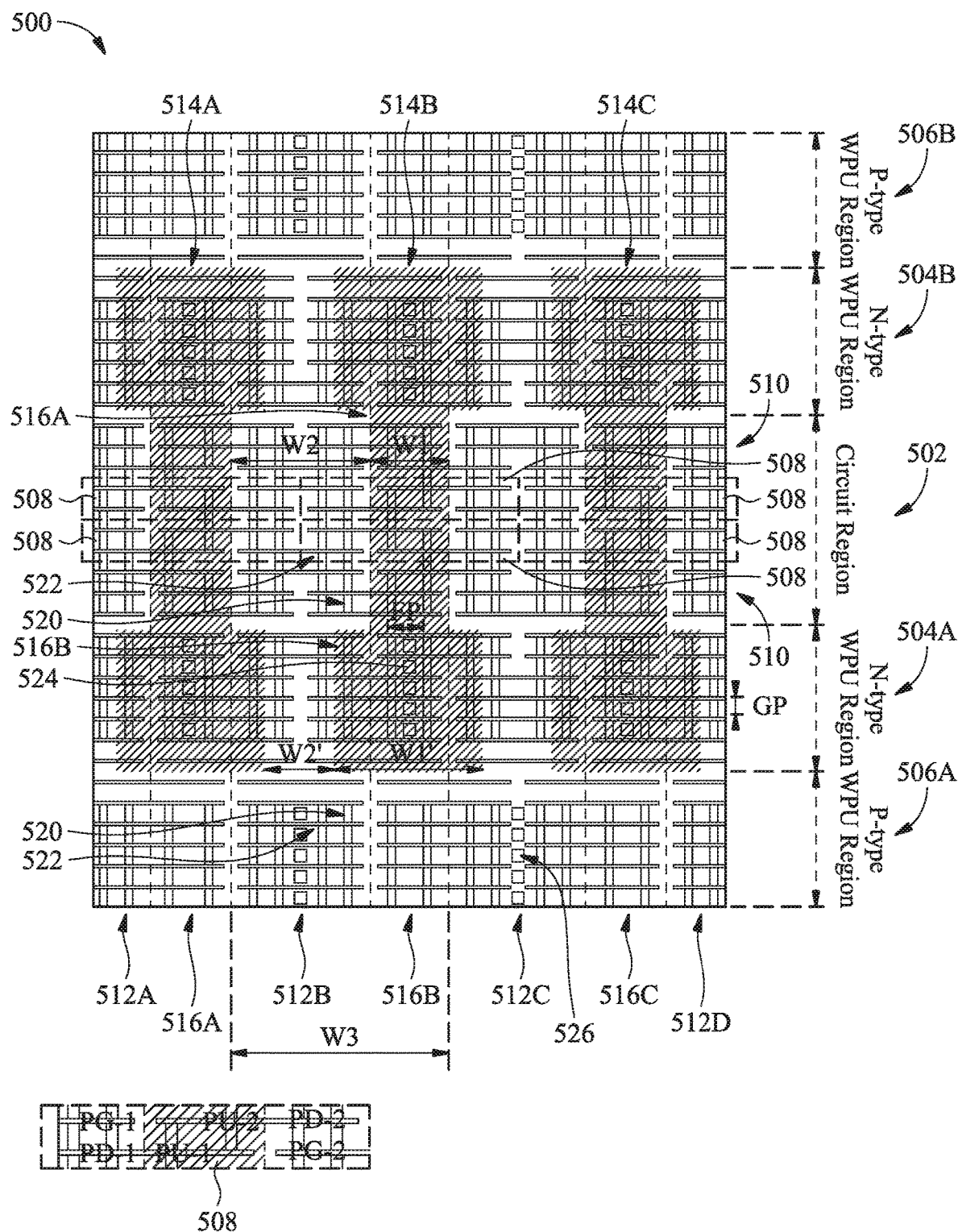

FIG. 7 is a fragmentary top view of a portion of SRAM array 500 in another embodiment of the present disclosure. Reference numerals in FIGS. 5 and 7 are repeated for ease of understanding. Many aspects of SRAM cell 500 are the same as to what have been discussed above with reference to FIG. 5 and omitted here for the sake of convenience. One difference of SRAM array 500 in FIG. 7 compared with FIG. 5 is that width of an n-well 514 in n-type WPU region 504 expands from W1 to W1'. In some implementations, W1' is two or three fin pitches (denoted as FP) wider than W1. For example, n-well 516 may expand one fin pitch on each side of n-well 516 to expand a width by two fin pitches (W1'=W1+2FP) in total, while the width of n-well 516 in circuit region 502 remains W1. In the illustrated embodiment, by extending one fin pitch on each side, n-well 516 extends to beneath an adjacent active region 520 that would otherwise be above p-well 512. While along this active region 520's lengthwise extension (along a y-direction) into circuit region 502, the other active region 520 remains over p-well 512.

Well boundary 516 is split into two segments 516A and 516B which are no longer aligned along a y-direction but generally parallel and spaced apart along an x-direction. Segment 516A of well boundary is between n-well 514 and p-well 512 in circuit region 502, and segment 516B of well boundary is between n-well 514 and p-well 512 in n-type WPU regions 504, which is offset by (W1'−W1)/2 along an x-direction. Enlarging width of n-well 514 in n-type WPU regions 504 by W1'−W1 effectively increases n-well width, which mitigates equivalent width reduction due to diffusion areas 530 (FIG. 6) between oppositely doped wells. In some embodiments, n-type pick-up structures' resistance is reduced about one or two orders compared with n-well with a uniform width. In a specific example, by enlarging n-well width in n-type WPU regions 540, n-type pick-up structures' resistance is reduced down to less than about 5% compared with n-type pick-up structures without enlarging n-well width, such as about 1%.

Enlarging (or expanding) width of n-wells 514 reduces width of p-well 512 in n-type WPU regions 504 from W2 down to W2'. In some implementations, W2' is two or three fin pitches narrower than W2. A p-well 512's expanded width W3 in p-type WPU regions 506 remains the same and roughly has a relationship of W3=W1'+W2' (i.e., W3>W1'). Since in n-type WPU regions 504, p-wells are generally wider than n-wells, and further since p-well pick-up structures are in p-type WPU region 506 instead of in n-type WPU region 504, the p-well width reduction in n-type WPU region 504 relatively has small impact on p-well pick-up structure's resistance. Overall, expanding width of n-well 514 in n-type WPU regions 504 significantly reduces n-well pick-up structure's resistance without sacrificing p-well pick-up structure's resistance.

Figure 8:
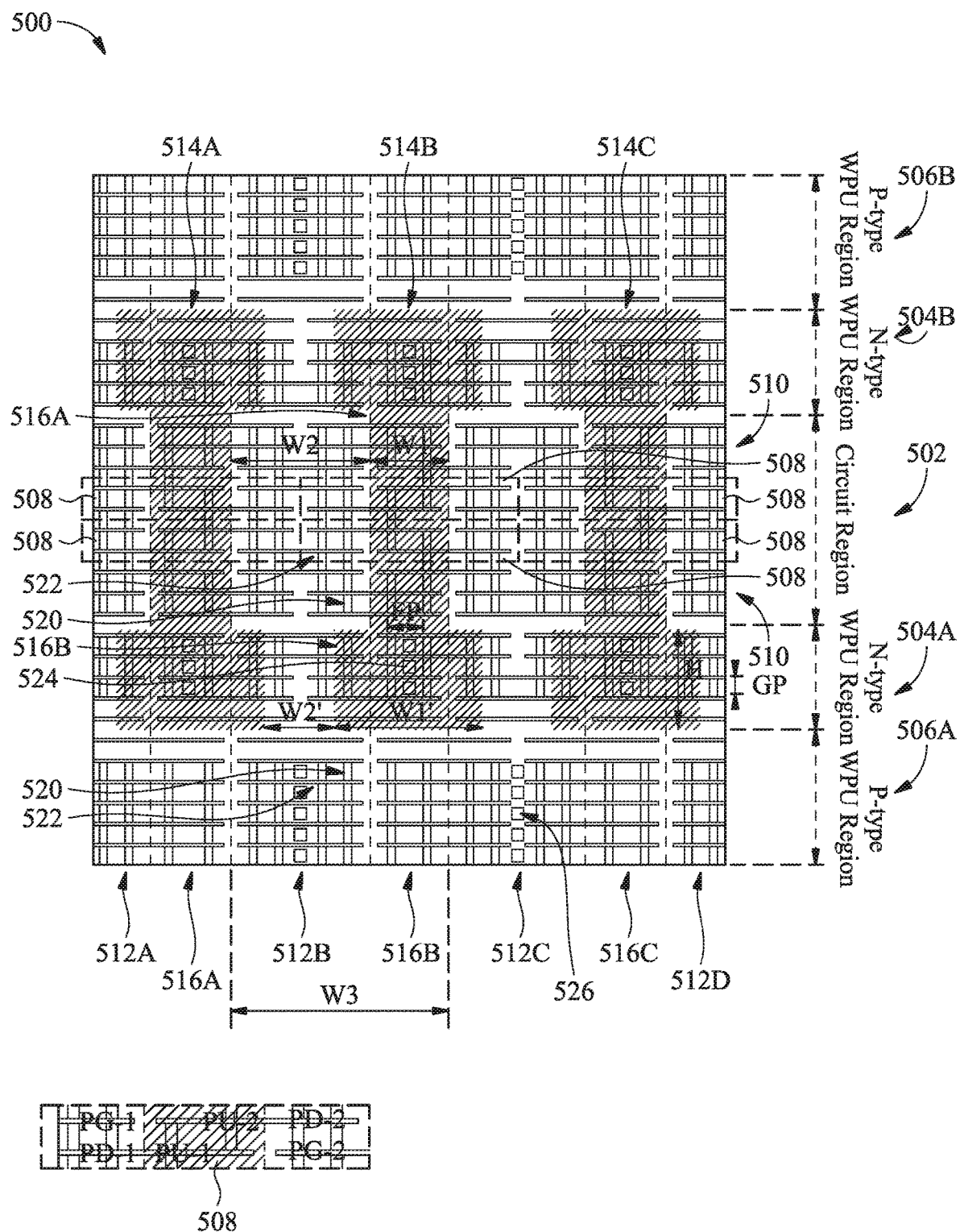

Enlarging (or expanding) width of n-wells 514 in n-type WPU regions 504 also advantageously allows reducing number of rows of contact features 524, which in turn saves more chip areas. FIG. 8 is a fragmentary top view of a portion of SRAM array 500 in yet another embodiment of the present disclosure. Reference numerals in FIGS. 7 and 8 are repeated for ease of understanding. Many aspects of SRAM cell 500 are the same as to what have been discussed above with reference to FIG. 7 and omitted here for the sake of convenience. One difference of SRAM array 500 in FIG. 8 compared with FIG. 7 is that height (H) of n-type WPU region 504 is reduced, such as by two gate pitches (GP) in the depicted embodiment. Accordingly, number of rows of contact features 524 is also reduced. In the depicted embodiment, number of rows of contact features 524 in n-type WPU region 504 is less than that of contact features 526 in p-type WPU region 506 by two. Having a less number of contact features generally increases the resistance of the well pick-up structure. However, in the embodiment illustrated in FIG. 8, a less number of contact features is compensated by resistance reduction introduced by a wider n-well in n-type WPU regions 504. Overall, resistance of the n-type well pick-up structure may maintain at the same level or even less. Without sacrificing the resistance of the n-type well-pick up structure, layout areas can be saved by reducing height of n-type WPU region 504. In some embodiments, by reducing height of n-type WPU region 504 alone could save about 10% to about 15% (e.g., 13%) area from SRAM array 500.

Figure 9:
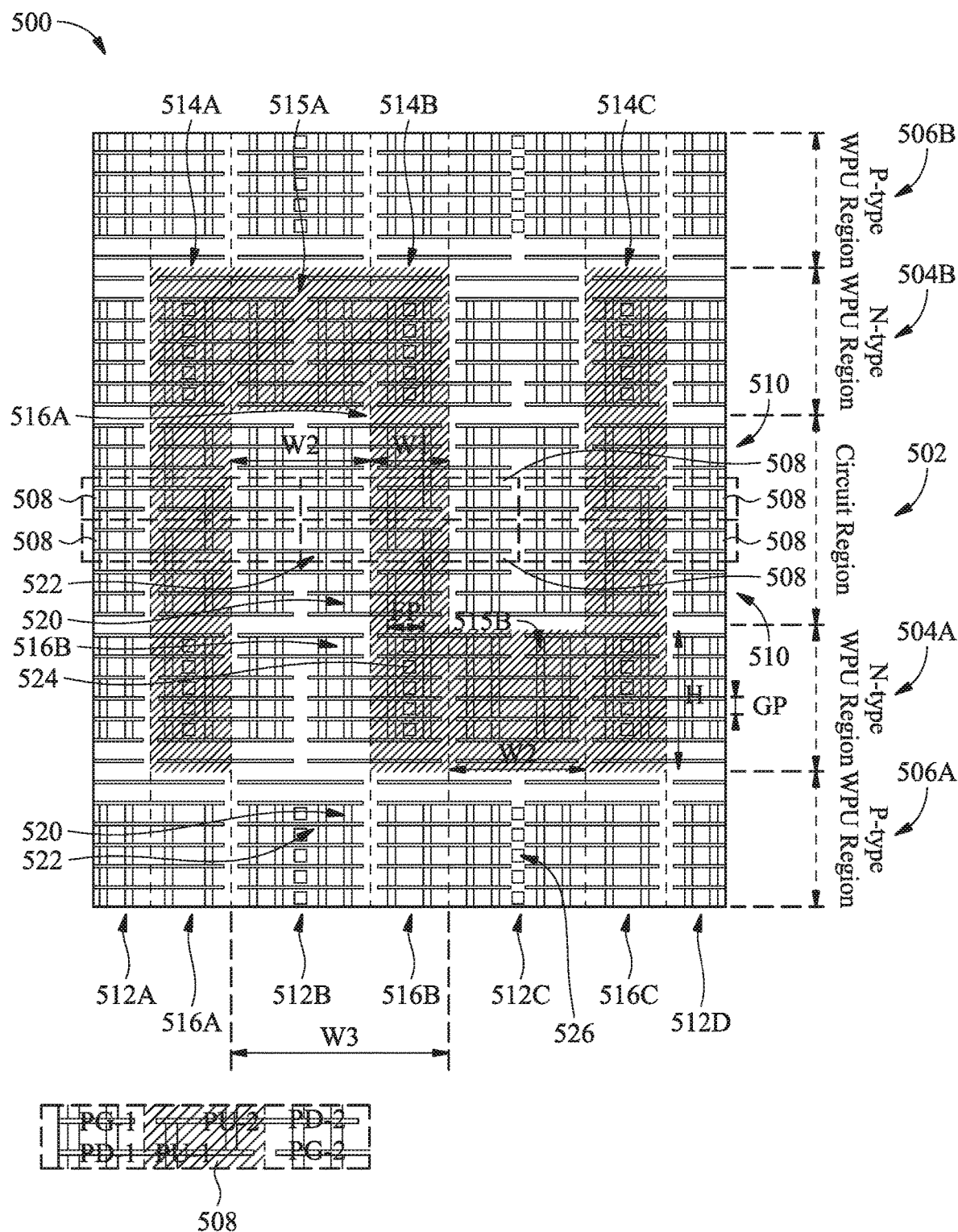

FIG. 9 is a fragmentary top view of a portion of SRAM array 500 in yet another embodiment of the present disclosure. Reference numerals in FIGS. 7 and 9 are repeated for ease of understanding. Many aspects of SRAM cell 500 are the same as to what have been discussed above with reference to FIG. 7 and omitted here for the sake of convenience. Similar as the embodiment depicted in FIG. 7, width of n-well 514 is enlarged in n-type WPU region 504 to reduce n-well resistance. One difference is that in the embodiment depicted in FIG. 9, in each of n-type WPU regions 504A and 504B, n-well 514 expands laterally along an x-direction to connect with a neighboring n-well 514. For example, in n-type WPU region 504A, n-well 514B expands an n-well linking portion 515B from an edge facing n-well 514C and connects with n-well 514C. The other edge of n-well 514B facing n-well 514A remains unchanged in n-type WPU region 504A. Yet, in n-type WPU region 504B, n-well 514B expands an n-well linking portion 515A from the other edge facing n-well 514A and connects with n-well 514A. The edge facing n-well 514C remains unchanged in n-type WPU region 504B. In this way, since all n-wells 514 are connected, they can also be regarded as one single larger n-well with an "serpentine" shape (or an "S" shape as depicted in FIG. 9). In the depicted embodiment, only three n-wells 514 are illustrated with n-wells 514A and 514C disposed near two edge of SRAM array 500. If in other embodiments, there are other n-wells disposed along an x-direction outside of n-wells 514A and 514C, similarly, n-well 514A will extend an n-well linking portion in n-type WPU region 504A outwardly to connect with another neighboring n-well, and n-well 514C will extend an n-well linking portion in n-type WPU region 504B outwardly to connect with yet another neighboring n-well. By connecting all n-wells 514 together, n-wells 514 have an expanded width in the n-type WPU region 504, also the number of diffusion regions 530 (FIG. 6) in each N-type WPU region 504 is reduced by half, which jointly help reducing resistance of n-well pick-up structures.

Still referring to FIG. 9, n-well linking portion 515A separates p-well 512B from connecting to p-type WPU region 506B, and n-well linking portion 515B separates p-well 512C from connecting to p-type WPU region 506A. Since all p-wells are still connected as portions of one single larger p-well, which effectively lowers the resistance of p-well pick-up structures, a balance between resistances of p-well pick-up structures and n-well pick-up structures are able to achieve. Further, although in the depicted embodiment, number of rows of contact features 524 in each n-type WPU region 504 equals to number of rows of contact features 526 in each p-type WPU region 506, number of rows of contact features 524 can be reduced (e.g., n-type WPU region 504 can be reduced in height (H)) to save production cost and to save layout area. For example, number of rows of contact features 524 may be reduced by two, and n-type WPU region 504 may be reduced in height (H) by two gate pitches (GP) in some embodiments.

Although not intended to be limiting, one or more embodiments of the present disclosure provide many benefits to a semiconductor device and the formation thereof. For example, embodiments of the present disclosure provide reduced n-well pick-up resistance in well pick-up (WPU) regions of a memory macro, by mitigating impacts from diffusion areas along well boundaries between adjacent oppositely doped wells. Further, reduction of n-well pick-up resistance does not sacrifice p-well pick-up resistance, with a balance of n-well and p-well pick-up resistances achieved. Further, embodiments of the present disclosure can be readily integrated into existing semiconductor manufacturing processes.

In one exemplary aspect, the present disclosure is directed to a semiconductor device. The semiconductor device includes a circuit region; a first well pick-up (WPU) region; a first well oriented lengthwise along a first direction in the circuit region and extending into the first WPU region, the first well having a first conductivity type; and a second well oriented lengthwise along the first direction in the circuit region and extending into the first WPU region, the second well having a second conductivity type different from the first conductivity type, wherein: the first well has a first portion in the circuit region and a second portion in the first WPU region, the first portion of the first well and the second well form a first well boundary, the second portion of the first well and the second well form a second well boundary, and the second portion of the first well has a width larger than the first portion of the first well along a second direction perpendicular to the first direction. In some embodiments, the semiconductor device further includes a second WPU region, wherein: the first WPU region is disposed between the circuit region and the second WPU region, the second well extends further into the second WPU region, and the second well has a portion in the second WPU region with a width larger than other portions of the second well in either the circuit region or the first WPU region along the second direction. In some embodiments, the width of the portion of the second well in the second WPU region is larger than the width of the second portion of the first well in the first WPU region along the second direction. In some embodiments, the semiconductor device further includes first contact features disposed over the first well in the first WPU region and arranged in a first number of rows along the first direction; and second contact features disposed over the second well in the second WPU region and arranged in a second number of rows along the first direction. In some embodiments, the first number of rows equals the second number of rows. In some embodiments, the first number of rows is less than the second number of rows. In some embodiments, the first well boundary and the second well boundary are aligned along the first direction. In some embodiments, the first well boundary and the second well boundary are generally parallel and spaced along the second direction. In some embodiments, the first well further includes a third portion in the circuit region, the third portion is generally parallel with the first portion of the first well, and the third portion connects with the second portion of the first well. In some embodiments, the semiconductor device further includes a first active region extending lengthwise along the first direction over the first well in the WPU region; and a second active region extending lengthwise along the first direction over the second well in the circuit region, wherein first and second active regions are lengthwise generally aligned along the first direction. In some embodiments, the first and second active regions are discontinued at a boundary between the circuit region and the first WPU region. In some embodiments, the first well is an n-type well and the second well is a p-type well.

In another exemplary aspect, the present disclosure is directed to a memory macro. The memory macro includes a memory bit cell region; a first well pick-up (WPU) region on a first side of the memory bit cell region; a second WPU region on the first side of the memory bit cell region, wherein the memory bit cell region, the first WPU region, and second WPU region are arranged along a first direction in sequence; and n-type wells and p-type wells arranged alternately in the memory bit cell region along a second direction perpendicular to the first direction, wherein the n-type wells extend along the first direction into the first WPU region, wherein at least one of the p-type wells extends along the first direction across the first WPU region and into the second WPU region, wherein at least one of the n-type wells has a potion in the first WPU region with a width larger than another portion in the memory bit cell region along the second direction. In some embodiments, the n-type wells and p-type wells are also arranged alternately in the first WPU region along the second direction, such that the at least one of the n-type wells is separated from the adjacent n-type wells by the p-type wells. In some embodiments, the at least one of the n-type wells connects with one of the adjacent n-type wells in the first WPU region. In some embodiments, the memory macro further includes a third WPU region on a second side of the memory bit cell region, the second side opposing the first side, the n-type wells extending along the first direction into the third WPU region, wherein the at least one of the n-type wells connects with the other one of the adjacent n-type wells in the third WPU region. In some embodiments, wherein the second WPU region is free of the n-type wells.

In yet another exemplary aspect, the present disclosure is directed to a layout of a static random access memory (SRAM) array. The layout includes a memory bit cell area; a well pick-up (WPU) area adjacent to the memory bit cell area; a n-type well and a p-type well each oriented lengthwise along a first direction in the memory bit cell area and the WPU area, the n-type and p-type wells having a well boundary therebetween; a first fin oriented lengthwise along the first direction in the memory bit cell area and the WPU area, the first fin including a first segment over the n-type well and a second segment over the p-type well, the second segment being disconnected from the first segment; and gate structures over the first fin in the memory bit cell area and oriented lengthwise along a second direction perpendicular to the first direction. In some embodiments, the layout further includes first contact features disposed over the n-type well; and second contact features disposed over the p-type well, wherein a number of rows of the first contact features along the first direction is less than the second contact features. In some embodiments, the layout further includes a second fin adjacent to the first fin, wherein the second fin extends lengthwise along the first direction over the p-type well in both the memory bit cell area and the WPU area.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a circuit region;
a first well pick-up (WPU) region;
a second WPU region, wherein the circuit region, the first WPU region, and the second WPU region are arranged along a first direction in sequence;
a first well of a first conductivity type, wherein the first well has a first portion disposed in the circuit region and a second portion disposed in the first WPU region; and
a second well of a second conductivity type different from the first conductivity type, wherein the second well has a first portion disposed in the circuit region, a second portion disposed in the first WPU region, and a third potion disposed in the second WPU region,
wherein measured along the first direction a width of the first WPU region is less than a width of the second WPU region.

2. The semiconductor device of claim 1, wherein the first and second portions of the first well are physically continuous.

3. The semiconductor device of claim 1, wherein the first, second, and third portions of the second well are physically continuous.

4. The semiconductor device of claim 1, wherein the first conductivity type is n-type, and the second conductivity type is p-type.

5. The semiconductor device of claim 1, wherein the first WPU region includes first contact features arranged in a first number of rows along the first direction, the second WPU region includes second contact features arranged in a second number of rows along the first direction, and the first number is less than the second number.

6. The semiconductor device of claim 5, wherein the first number is less than the second number by two.

7. The semiconductor device of claim 1, wherein the second well fully surrounds the first well.

8. The semiconductor device of claim 1, wherein the circuit region includes a memory array.

9. The semiconductor device of claim 1, wherein measured along a second direction perpendicular to the first direction a width of the first portion of the first well is less than a width of the second portion of the first well.

10. The semiconductor device of claim 1, wherein measured along a second direction perpendicular to the first direction a width of the first portion of the second well is larger than a width of the second portion of the second well.

11. A semiconductor device, comprising:
a circuit region including a first plurality of gate structures arranged along a first direction and each extending lengthwise along a second direction perpendicular to the first direction;
a first bias region including an n-well and a p-well, the first bias region including a second plurality of gate structures arranged along the first direction and each extending lengthwise along the second direction; and
a second bias region free of an n-well, the second bias region including a third plurality of gate structures arranged along the first direction and each extending lengthwise along the second direction,
wherein the circuit region, the first bias region, and the second bias region are arranged along the first direction in sequence,
wherein each of the first plurality of gate structures, the second plurality of gate structures, and the third plurality of gate structures includes a same gate pitch, and
wherein along the first direction a width of the first bias region measured in a number of the gate pitches is less than a width of the second bias region measured in a number of the gate pitches.

12. The semiconductor device of claim 11, wherein the width of the first bias region is less than the width of the second bias region by two gate pitches.

13. The semiconductor device of claim 11, wherein the n-well extends along the first direction into the circuit region, and the p-well extends along the first direction into the circuit region.

14. The semiconductor device of claim 13, wherein the n-well physically interfaces with the p-well to form a first well boundary in the circuit region extending along the first direction and a second well boundary in the first bias region extending along the first direction, and the first well boundary is offset from the second well boundary along the second direction.

15. The semiconductor device of claim 11, wherein the first bias region is configured to bias the n-well, and the second bias region is configured to bias the p-well.

16. The semiconductor device of claim 11, wherein the n-well is fully surrounded by the p-well.

17. A semiconductor device, comprising:
an n-well;
a p-well fully surrounding the n-well; and
a memory cell including a first pass-gate transistor and a first pull-down transistor disposed on a first portion of the p-well, a first pull-up transistor and a second pull-up transistor disposed on the n-well, and a second pass-gate transistor and a second pull-down transistor disposed on a second portion of the p-well,
wherein the first portion of the p-well, the n-well, and the second portion of the p-well are disposed along a first direction in sequence.

18. The semiconductor device of claim 17, wherein the n-well incudes a non-uniform width measured along the first direction.

19. The semiconductor device of claim 17, wherein the p-well includes a third portion connecting the first and second portions, the n-well and the third portion of the p-well are disposed along a second direction in sequence, and the second direction is perpendicular to the first direction.

20. The semiconductor device of claim 19, further comprising:
a plurality of contacts arranged in rows along the second direction, wherein:
a portion of the rows are disposed over the n-well,
a remaining portion of the rows are disposed over the third portion of the p-well, and
a number of the portion of the rows is less than a number of the remaining portion of the rows.

* * * * *